US008853533B2

(12) United States Patent
Jenrich

(10) Patent No.: US 8,853,533 B2
(45) Date of Patent: Oct. 7, 2014

(54) CONTACT-MAKING AND CONNECTION ARRANGEMENT ON THE BASIS OF FILM CONDUCTORS INTRODUCED IN A HOUSING

(75) Inventor: André Jenrich, Leipzig (DE)

(73) Assignee: Few Fahrzeugelektrikwerk GmbH & Co., Zwenkau (DE)

( * ) Notice: Subject to any disclaimer, the term of this patent is extended or adjusted under 35 U.S.C. 154(b) by 179 days.

(21) Appl. No.: 13/695,180

(22) PCT Filed: Apr. 29, 2011

(86) PCT No.: PCT/EP2011/056845

§ 371 (c)(1), (2), (4) Date: Oct. 29, 2012

(87) PCT Pub. No.: WO2011/135077

PCT Pub. Date: Nov. 3, 2011

(65) Prior Publication Data

US 2013/0037296 A1 Feb. 14, 2013

(30) Foreign Application Priority Data

Apr. 30, 2010 (DE) ......................... 10 2010 018 858

(51) Int. Cl.

*H05K 5/00* (2006.01)
*H01R 12/61* (2011.01)
*H01R 4/04* (2006.01)

(52) U.S. Cl.

CPC ................ *H01R 4/04* (2013.01); *H01R 12/613* (2013.01); *Y10S 248/906* (2013.01)

USPC .............................. 174/50; 439/535; 248/906

(58) Field of Classification Search

CPC ................................ H01R 12/613; H01R 4/04

USPC ........ 174/50, 84 R, 88 R; 220/4.02; 439/535; 248/906

See application file for complete search history.

(56) References Cited

U.S. PATENT DOCUMENTS

| | | | |
|---|---|---|---|
| 4,113,981 | A | 9/1978 | Fujita et al. |
| 6,017,244 | A | 1/2000 | Daane |

(Continued)

FOREIGN PATENT DOCUMENTS

| | | |
|---|---|---|
| DE | 19642178 | 4/1998 |
| DE | 19705860 | 8/1998 |
| DE | 198 32 011 | 2/2000 |
| DE | 10050797 | 4/2002 |

*Primary Examiner* — Dhirubhai R Patel

(74) *Attorney, Agent, or Firm* — Hamre, Schumann, Mueller & Larson, P.C.

(57) ABSTRACT

The invention relates to a contact-making and connection arrangement on the basis of film conductors introduced in a housing, wherein ends of the film conductors have a contact-making section and at least partly lie one above another. According to the invention, a double-sided self-adhesive or adhesive-coated conductive nonwoven material is situated between the contact-making sections facing one another, said material mechanically and electrically connecting the ends of the film conductors. Furthermore, the housing is embodied such that it is divided in the plane of the film conductors that have been introduced or are to be introduced, wherein the housing parts form half-shells and, in at least one half-shell, stamp-like projections are provided which lead to a deformation of the contact-making layer in such a way that a reduction of the electrical contact resistance of the connection occurs.

7 Claims, 3 Drawing Sheets

(56) References Cited

U.S. PATENT DOCUMENTS 7,253,362 B1 * 8/2007 Dower et al. ............... 174/84 R
7,285,725 B1 * 10/2007 Saman ........................ 174/84 R
7,485,802 B2 * 2/2009 Yoshida et al. ................. 174/50
8,076,579 B2 * 12/2011 Ikeda .......................... 174/72 C
2007/0042623 A1 2/2007 Yeh et al.
2010/0075529 A1 3/2010 Niitsu

* cited by examiner

CONTACT-MAKING AND CONNECTION ARRANGEMENT ON THE BASIS OF FILM CONDUCTORS INTRODUCED IN A HOUSING

DESCIPTION

The invention relates to a contact and connection arrangement based on film conductors installed in a housing, wherein ends of the film conductors have a contact segment and at least partially overlap each other, according to the preamble of claim 1.

The use of film connectors as conductors with a flat design for the purpose of supplying power to heating fields of composite glass panes is known, particularly for the use thereof in automobile construction.

In this case, conductors carrying current outside of the composite glass are typically designed with cables with corresponding connection options, the same being located in a housing, to the on-board power supply. However, the available cables and housing disturb the manufacturing process during the production of the composite glass, such that alternative manufacturing processes which are unattractive from a cost perspective must be utilized.

For this reason, it has already been suggested to manufacture the panes only with film conductors based on Kapton, meaning based on polyimide films, and to subsequently realize the contact with the necessary cable/housing extension by means of soldering. However, this technology is not optimal either, because problems arise during the subsequent sealing of the connection points. In addition, the production of a solder connection leads to significant costs.

From the foregoing, therefore, the problem addressed by the invention is that of providing a further developed contact and connection arrangement based an film conductors installed in a housing, the ends of which have a contact segment, wherein the technical implementation thereof is possible without additional manufacturing equipment.

The solution of the problem addressed by the invention is realized by the combination of features according to claim 1, wherein the independent claims illustrate at least practical embodiments and implementations.

As such, the invention proceeds from a contact and connection arrangement based on film conductors installed in a housing, wherein ends of the film conductors have a contact segment and at least partially overlap each other. Polyimide insulating films are preferably used as the film conductors, and either have a conductive coating, or wherein [sic] a conductive intermediate layer is present between two such insulating films. Polyimide films possess high electric strength as well as very good heat conductance combined with extreme temperature stability.

According to the invention, a double-sided conductive fleece material, which is self-adhesive or which is coated with a glue, said fleece material being in the form of a fleece material strip, for example, is arranged between the contact segments of the film conductors which face each other. The fleece material connects the ends of the film conductor mechanically and electrically.

The housing which accommodates the contact segment is designed in sections in the plane of the installed film conductors, wherein the housing parts preferably form half shells, and stamp-like projections are included in at least one half shell.

The stamp-like projections indicated above lead to a deformation of the contact layer in such a manner that a reduction of the electrical contact resistance occurs in the connection segment.

In this case, the stamp-like projections do not press through the contact segments of the ends of the film conductors, but rather only result in the indicated deformation.

As part of the design, one of the housing half shells has pin-like projections, and the other housing half shell has hollow cylindrical segments or projections, wherein the pin-like projections and the hollow-cylindrical segments or projections are designed as substantially complementary and congruent, in order to allow parts of the contact layers shaped by the respective pin-like projections to press into the complementary segment or projection without penetrating the same. When the housing half shells are joined, together, with the pin-like projections and the hollow cylindrical segments or projections performing their functions, a compression and a sealing of the conductive fleece material results, such that the conductance and ampacity thereof is increased.

The housing half shells can be connected by a film or foil joint, such that the assembly thereof is further simplified.

In addition, a glue charge which can be heat activated is located in the housing in order to effect a seal by means of the application of heat following the closing of the housing. In this case, the glue charge is brought into a flowing form, with subsequent curing upon cooling. Later measures for sealing are not necessary.

A radius is formed on the free ends of each of the pin-like projections in order to prevent the destruction of the contact segments of the film conductors.

The housing halves can be fixed to or against each other via snap-in connections.

In addition, centering lugs and complementary centering recesses are preferably also located in the corner regions of the housing half shells, thereby ensuring that the pin-like projections and the assigned hollow cylindrical segments or projections are in their desired assigned locations.

In one embodiment of the invention, at least one of the housing half shells has a flat trough shape.

By means of the present teaching, there are significant cost savings during the manufacture or composite glass panes which have heating fields. The contact and connection of the film conductors is realized by means of gluing, with no additional manufacturing equipment being necessary. By using glue charges which can he activated by heat inside the housing, a sufficient seal is achieved, particularly against the incursion of moisture. Finally, a reduction of the contact resistance is realized by the shaping of the copper film composite, including the conductive fleece material.

The invention is explained in greater detail below with the example of one embodiment, and with reference to figures.

The illustrations in the figures proceed from two housing halves 1 and 2, designed as lower part 1 and upper part 2. A glue charge 3 is located in the inner edge region of the housing halves 1 and 2, and can be activated by heat.

Figure 1:
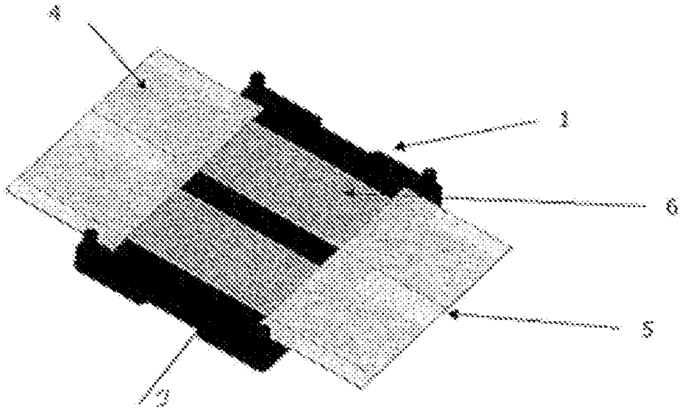
FIG. 1 shows an opened housing with installed film conductors and an exposed contact segment.

In the illustration according to FIG. 1, a first film conductor 4 is inserted and leads to the pane, which is not illustrated in the figure. A second film conductor 5 is connected to a connector strand, which is not illustrated.

Exposed contact segments 6 are connected electrically and mechanically with the insertion therebetween of a conductive fleece material which is adhesive on both sides.

Figure 2:
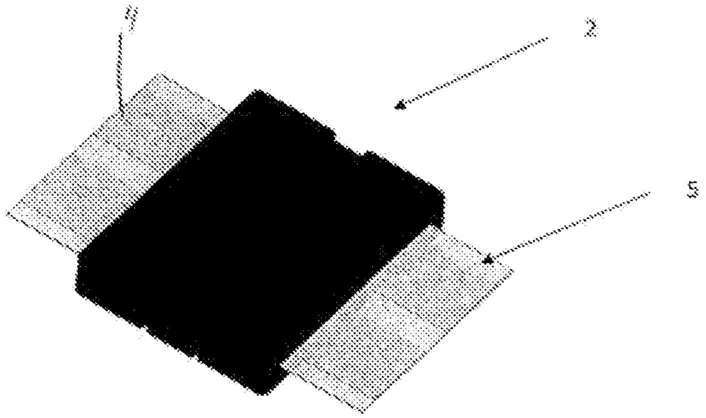
FIG. 2 shows an illustration similar to that in FIG. 1, but with a closed housing.

Upon the placement of the upper housing part 2, the closed housing construction illustrated in FIG. 2 results. The charges of heat-activated glue inserted into the halves of the housing are brought into a flowing state by the application of heat, with the result that a tight connection of the housing halves 1 and 2 is achieved.

Figure 3:
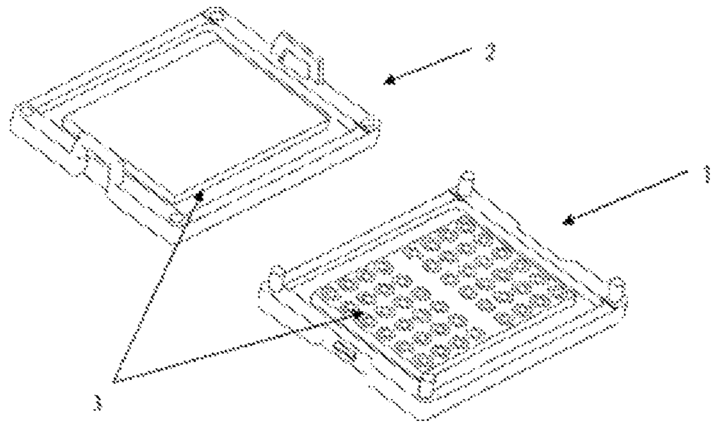
FIG. 3 shows housing half shells with complementary external contours, and pin-like projections located in one of the housing half shells, and hollow cylindrical segments arranged in the other housing half shell.
Figure 3:
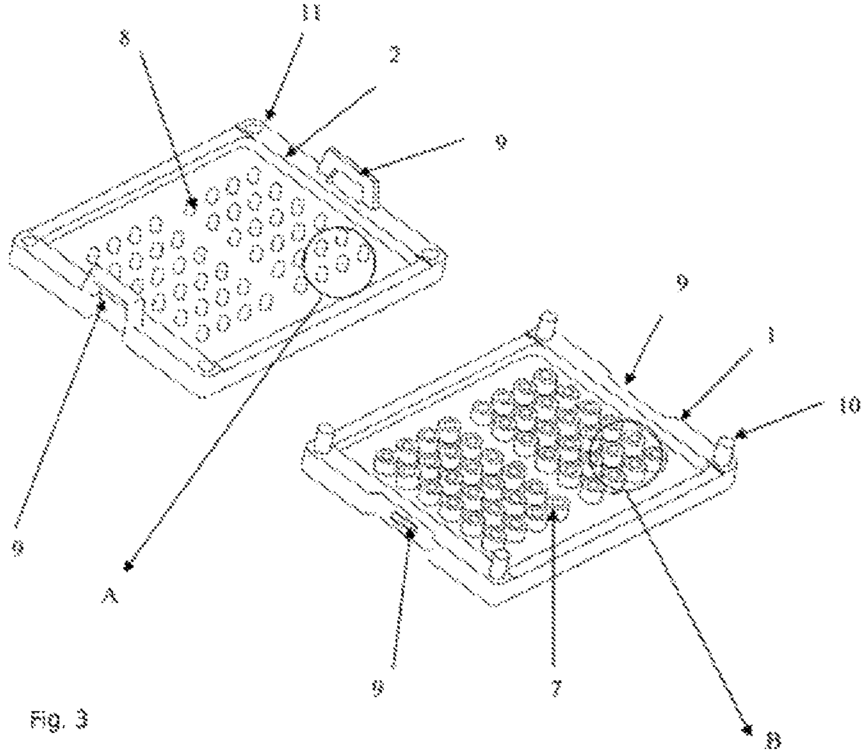
Figure 4:
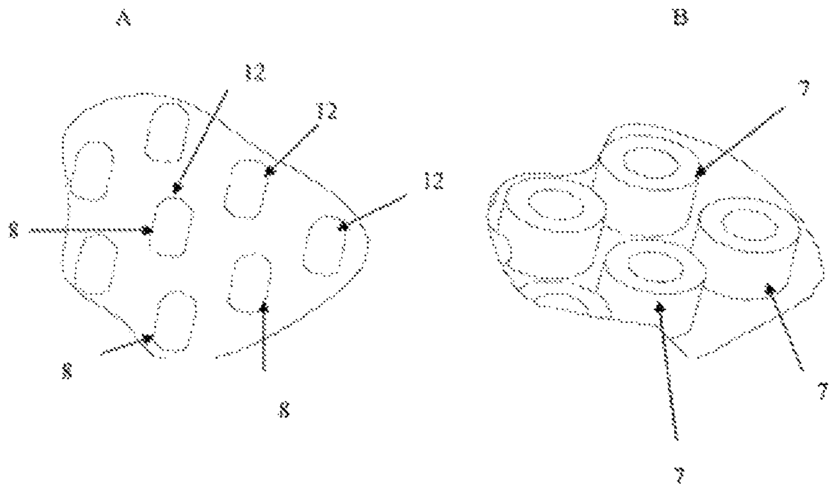
FIG. 4 shows a detailed view of the pin-like projections, as well as of the hollow cylindrical segments, each located in one of the housing halves according to FIG. 3.

A reduction of the contact resistance with respect to the contact segments and the intermediate layer of conductive material is possible by means of an implementation according to the illustrations in FIG. 3 and FIG. 4.

For this purpose, by way of example, hollow cylindrical segments or projections 7 are initially designed in the lower housing half 1 as preferably matrix-like.

Pin-like projections 8 are present in the upper housing half 2 in a manner which is preferably complementary to the spatial arrangements of these hollow cylindrical segments or projections 7.

Details on this point can be found in illustrations A and B in FIG. 4.

Upon the joining together of the housing halves 1 and 2, for example by means of the snap-in connection 9, the hollow cylindrical segments or projections 7 and the pin-like projections 8 which at this point lie opposite each other exert a pressure on the contact segments 6 and the fleece material, which is not illustrated in the figures, lying between said contact segments [6], and therefore effect a deformation of the same (see FIG. 1). In this way, the configuration achieves a reduction in the contact resistances as a result of the shaping of the copper film composite, and heating in the contact transition region is ruled out.

Centering lugs 10 work together with centering recesses 11 and ensure that the desired assigned orientations between the pin-like projections 8 and the hollow cylindrical segments 7 are preserved.

A sub-group of the pin-like projections 7 can be seen in the detailed view in FIG. 4A, and these possess a mushroom-shaped head 12. The mushroom-shaped bead 12 constitutes a radius formed thereon, and prevents an undesired penetration of the copper conductor path which comes in contact with the head.

In FIG. 4B, a sub-group of hollow cylindrical projections 7 can be seen which possess an approximately sleeve-like shape. The internal diameter of the hollow cylindrical projections 7 in this case is the same or is larger than the outer diameter of the pin-like projections 8 in the socket regions thereof.

The invention claimed is:

1. A contact and connection arrangement based on film conductors inserted in a housing, wherein ends of the film conductors have a contact segment and at least partially overlap each other, wherein a conductive fleece material which is self-adhesive on both sides or is coated with a glue is situated between the contact segments which face each other, and this fleece material connects the ends of the film conductors mechanically and electrically, in that the housing is designed sectionally in the plane of the film conductors, wherein the housing parts form half shells, and wherein one of the housing half shells has pin-like projections, wherein the pin-like projections and the hollow cylindrical segments or projections are designed as substantially complementary and congruent, in order to allow parts of contact layers which are shaped by the pin-like projections to press into the complementary segments or projections without penetrating the same and lead to a deformation of the contact layer in such a manner that a reduction of an electric contact resistance of the connection results.

2. An arrangement according to claim 1, wherein the housing half shells are connected by a film or foil joint.

3. An arrangement according to claim 1, wherein a glue charge which can be activated by heat is located in the housing in order to realize a seal following the closing of the housing.

4. An arrangement according to claim 1, wherein a radius is formed on each of the free ends of the pin-like projections.

5. An arrangement according to claim 1, wherein the housing halves can be fixed to each other via a snap-in connection.

6. An arrangement according to claim 1, wherein centering lugs and centering recesses are preferably located in corner regions of the housing half shells.

7. An arrangement according to claim 1, wherein at least one of the housing shells has a flat trough shape.

* * * * *